United States Patent
Han

(10) Patent No.: US 8,762,094 B2
(45) Date of Patent: Jun. 24, 2014

(54) METHOD FOR CALIBRATING FREQUENCY OF $G_m$-C FILTER AND DEVICES USING THE METHOD

(75) Inventor: Yun-Cheol Han, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 575 days.

(21) Appl. No.: 12/984,223

(22) Filed: Jan. 4, 2011

(65) Prior Publication Data
US 2011/0166817 A1   Jul. 7, 2011

(30) Foreign Application Priority Data

Jan. 6, 2010   (KR) .................. 10-2010-0000705

(51) Int. Cl.
*G06F 19/00*   (2011.01)
*H03H 11/12*   (2006.01)

(52) U.S. Cl.
CPC .................. *H03H 11/1291* (2013.01)
USPC .......................... 702/107; 327/553

(58) Field of Classification Search
CPC ....... H03H 11/1291; H03H 5/00; G06F 19/00
USPC ............ 327/551, 552, 553, 336; 702/17, 107, 702/190, 194, 85, 106
See application file for complete search history.

(56) References Cited

U.S. PATENT DOCUMENTS

| | | | | |
|---|---|---|---|---|
| 5,953,379 A | * | 9/1999 | Myers et al. | 375/344 |
| 7,675,370 B2 | * | 3/2010 | Sun et al. | 331/44 |
| 2002/0008572 A1 | * | 1/2002 | Hayashi et al. | 327/552 |
| 2008/0191778 A1 | * | 8/2008 | Huang et al. | 327/336 |
| 2009/0231027 A1 | * | 9/2009 | Park | 327/551 |
| 2011/0025411 A1 | * | 2/2011 | Piazza et al. | 327/553 |

FOREIGN PATENT DOCUMENTS

WO   WO 2006128075 A1 * 11/2006 ............. H03H 11/12

* cited by examiner

*Primary Examiner* — Sujoy Kundu
*Assistant Examiner* — Corey Bailey
(74) *Attorney, Agent, or Firm* — Lee & Morse, P.C.

(57) ABSTRACT

A method of calibrating the frequency of a $g_m$-C filter is provided. The method includes generating, by a frequency calibration circuit, a calibration code capable of tuning a cut-off frequency of the $g_m$-C filter according to a frequency of an oscillation signal that is output from a $g_m$-C oscillator and indicates a process distribution and a reference code, determining, by the frequency calibration circuit, whether the calibration code exists within a range of a reference code, and outputting, by the frequency calibration circuit, the calibration code to the $g_m$-C filter or generating a variable current to simultaneously tune transconductance of the $g_m$-C oscillator and transconductance of the $g_m$-C filter, according to a result of the determination.

14 Claims, 6 Drawing Sheets

METHOD FOR CALIBRATING FREQUENCY OF $G_m$-C FILTER AND DEVICES USING THE METHOD

BACKGROUND

1. Field

Exemplary embodiments relate to a semiconductor circuit having a $g_m$-C filter embedded therein, and more particularly, to a method of calibrating a frequency of the $g_m$-C filter, by which a change in the frequency characteristics of the $g_m$-C filter due to a process distribution as a result of semiconductor manufacturing process may be compensated for, and devices that may perform such a calibration method.

2. Description of the Related Art

The radio frequency (RF) front end of a receiver of a wireless communication device includes an analog filter capable of selecting a desired frequency from a received signal. Examples of the analog filter may include a switched capacitor filter (SCF), a MOSFET filter, a filter having an operational transconductance amplifier (OTA) structure, and the like. The filter having an OTA structure (which is also called as an OTA filter) is usually used to obtain filter characteristics from a frequency band of several tens of MHz.

The $g_m$-C filter using transconductance $g_m$ is the most frequently used as the OTA filter. The $g_m$-C filter is widely used for restoration of a received signal and anti-aliasing of a transmission signal in communication equipment. The $g_m$-C filter includes a transconductor and a capacitor.

Transconductance $g_m$ of the transconductor and capacitance C of the capacitor in the $g_m$-C filter are important factors in determining a cut-off frequency of the $g_m$-C filter. The cut-off frequency of the $g_m$-C filter is proportional to the transconductance and inversely proportional to the capacitance. To realize a $g_m$-C filter having a high cut-off frequency capacitance may be reduced.

SUMMARY

One or more embodiments may provide a method of calibrating a frequency of a $g_m$-C filter, which may enable changes in frequency characteristics of the $g_m$-C filter, which may be a result of process distribution during manufacture of a semiconductor chip having the $g_m$-C filter built therein, to be compensated for.

One or more embodiments may provide a device adapted to perform a method of calibrating a frequency of a $g_m$-C filter, which may enable changes in frequency characteristics of the $g_m$-C filter, which may be a result of process distribution during manufacture of a semiconductor chip having the $g_m$-C filter built therein, to be compensated for.

One or more embodiments may provide a method of calibrating the frequency of a $g_m$-C filter, the method including generating, by a frequency calibration circuit, a calibration code capable of tuning a cut-off frequency of the $g_m$-C filter, according to a frequency of an oscillation signal that is output from a $g_m$-C oscillator and indicates a process distribution, and a reference code, determining, by the frequency calibration circuit, whether the calibration code exists within the range of a reference code; and outputting, by the frequency calibration circuit, the calibration code to the $g_m$-C filter or generating a variable current to simultaneously tune transconductance of the $g_m$-C oscillator and transconductance of the $g_m$-C filter, according to a result of the determination.

The frequency calibration circuit may generate the calibration code corresponding to a ratio of the reference code to the frequency of the oscillation signal.

The $g_m$-C oscillator may tune the transconductance of the $g_m$-C oscillator according to the variable current and may generate the oscillation signal having the frequency corresponding to a result of the tuning.

When the calibration code exists between a minimum value and a maximum value of the reference code, the frequency calibration circuit may output the calibration code for tuning the cut-off frequency of the $g_m$-C filter to the $g_m$-C filter.

When the calibration code is less than the minimum value of the reference code, the frequency calibration circuit may generate the variable current for decreasing the frequency of the oscillation signal, the $g_m$-C oscillator decreases the transconductance of the $g_m$-C oscillator in response to the variable current, and the $g_m$-C filter may decrease the transconductance of the $g_m$-C filter in response to the variable current.

When the calibration code is greater than the maximum value of the reference code, the frequency calibration circuit may generate the variable current for increasing the frequency of the oscillation signal, the $g_m$-C oscillator increases the transconductance of the $g_m$-C oscillator in response to the variable current, and the $g_m$-C filter may increase the transconductance of the $g_m$-C filter in response to the variable current.

The transconductance of the $g_m$-C oscillator may be tuned to the same variation value as a variation value of the transconductance of the $g_m$-C filter by the variable current.

One or more embodiments may provide a frequency calibration device capable of calibrating the frequency of a $g_m$-C filter, the frequency calibration device including a $g_m$-C oscillator which generates an oscillation signal having a frequency that varies according to a process distribution; and a frequency calibration circuit which generates a calibration code capable of tuning a cut-off frequency of the $g_m$-C filter, according to the frequency of the oscillation signal and a reference code.

The frequency calibration circuit may determine whether the calibration code exists within the range of the reference code, and may output the calibration code to the $g_m$-C filter or may generate a variable current to simultaneously tune transconductance of the $g_m$-C oscillator and transconductance of the $g_m$-C filter, according to a result of the determination.

The frequency calibration circuit may include a first register which stores the reference code; a second register which stores the calibration code; a third register which stores a current control code, a microprocessor which may generate the calibration code capable of tuning the cut-off frequency of the $g_m$-C filter according to the reference code stored in the first register and the frequency of the oscillation signal and stores the calibration code in the second register, and a variable current generation circuit which may generate a variable current for simultaneously tuning the transconductance of the $g_m$-C oscillator and the transconductance of the $g_m$-C filter in response to the current control code.

The microprocessor may determine whether the calibration code exists within the range of the reference code, tunes the calibration code according to a result of the determination, and may generate the current control code for tuning the variable current.

One or more embodiments may provide a data processing system including a recording medium configured to store data; a pickup unit configured to pick up the data stored in the recording medium, a voltage control amplifier configured to amplify a signal output by the pickup unit, a $g_m$-C filter configured to perform filtering on an amplified signal obtained by the voltage control amplifier, and a frequency calibration device configured to generate a calibration code or a reference current capable of tuning a cut-off frequency of the $g_m$-C filter.

The frequency calibration device may include a $g_m$-C oscillator which generates an oscillation signal having a frequency that varies according to a process distribution, and a frequency calibration circuit which may generate the calibration code according to the frequency of the oscillation signal and a reference code.

The frequency calibration circuit may determine whether the calibration code exists within the range of the reference code, and may generate the variable current for outputting the calibration code to the $g_m$-C filter or simultaneously tuning transconductance of the $g_m$-C oscillator and transconductance of the $g_m$-C filter according to a result of the determination.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Figure 1:
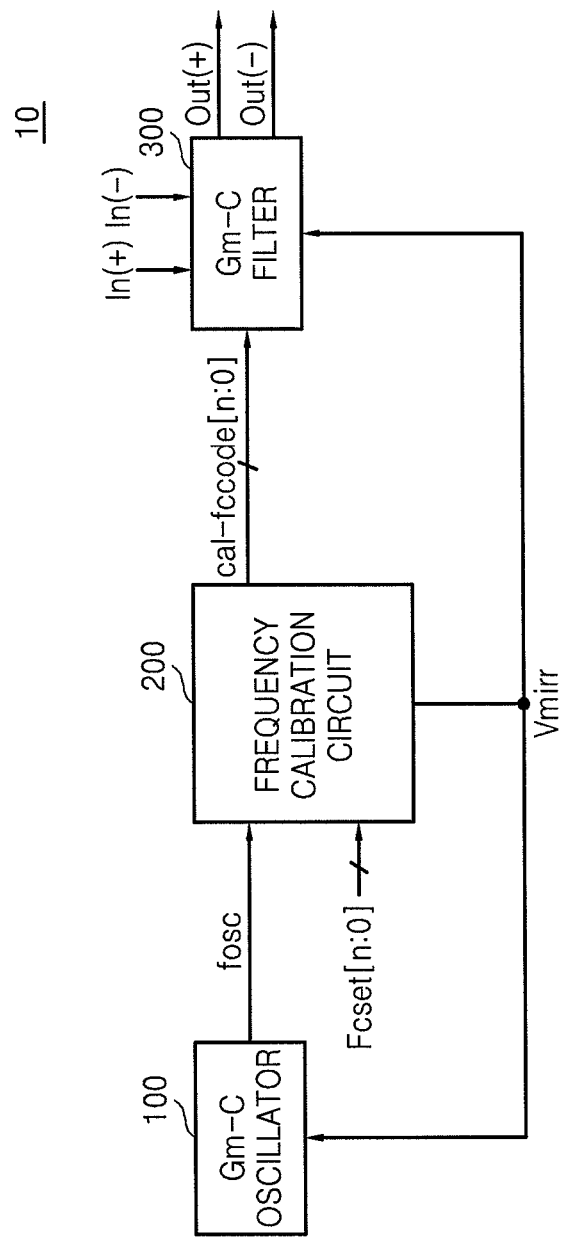
FIG. 1 illustrates a block diagram of an exemplary embodiment of a frequency calibration device.

Korean Patent Application No. 10-2010-0000705, filed on Jan. 6, 2010, in the Korean Intellectual Property Office, and entitled: "Method for Calibrating Frequency of $G_m$-C Filter and Devices Using the Method," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In addition, it will also be understood that when an element is referred to as being "connected" to another element, unless specified otherwise, it may be directly connected to the another element, or one or more intervening elements may be present. Like reference numerals refer to like elements throughout the specification.

FIG. 1 illustrates an exemplary embodiment of a block diagram of a frequency calibration device 10. Referring to FIG. 1, the frequency calibration device 10 may include a $g_m$-C oscillator 100, a frequency calibration circuit 200, and a $g_m$-C filter 300.

The gm-C oscillator 100 may generate an oscillation signal having a frequency $f_{osc}$ that varies according to a process variation and/or a process distribution. The frequency $f_{osc}$ of the oscillation signal may be determined based on transconductance and capacitance of the $g_m$-C oscillator 100.

The frequency calibration circuit 200 may generate a calibration code cal_fccode[n:0] capable of calibrating a cut-off frequency of the $g_m$-C filter 300. The calibration code cal_fccode[n:0] may be based on a reference code Fcset[n:0] and the frequency $f_{osc}$ of the oscillation signal. The frequency calibration circuit 200 may generate a variable current Vmirr and may output the variable current Vmirr to the $g_m$-C oscillator 100 and the $g_m$-C filter 300.

The frequency calibration circuit 200 may determine whether the calibration code cal_fccode[n:0] exists between a minimum value and a maximum value of the reference code Fcset[n:0]. Based on a result of the determination, the frequency calibration circuit 200 may output the calibration code cal_fccode[n:0] to the $g_m$-C filter 300 and/or may output the variable current Vmirr to the $g_m$-C oscillator 100 and the $g_m$-C filter 300.

More particularly, e.g., if the calibration code cal_fccode[n:0] is within a predetermined range, the frequency calibration circuit 200 may output the calibration code cal_fccode[n:0] to the $g_m$-C filter 300. If the calibration code cal_fccode[n:0] is not within the predetermined range, the frequency calibration circuit 200 may generate a variable current Vmirr and output the variable current Vmirr to the $g_m$-C oscillator 100 and the $g_m$-C filter 300. For example, the variable current Vmirr may coarsely tune (or calibrate) the cut-off frequency of the $g_m$-C filter 300. The calibration code cal_fccode[n:0] may finely tune (or calibrate) the cut-off frequency of the $g_m$-C filter 300.

The transconductance of the $g_m$-C oscillator 100 may be tuned according to the variable current Vmirr. The transconductance of the $g_m$-C filter 300 may be tuned according to the variable current Vmirr. More particularly, the transconductance of the $g_m$-C oscillator 100 the transconductance of the $g_m$-C filter 300 may be simultaneously according to the variable current Vmirr.

The calibration code cal_fccode[n:0] may be determined based on the reference code Fcset[n:0] and the frequency $f_{osc}$ of the oscillation signal. For example, the calibration code cal_fccode[n:0] may be proportional to the reference code Fcset[n:0] and may be inversely proportional to the frequency $f_{osc}$ of the oscillation signal. The calibration code cal_fccode[n:0] may be proportional to a frequency of a main clock signal that is provided to the frequency calibration circuit 200.

Figure 2:
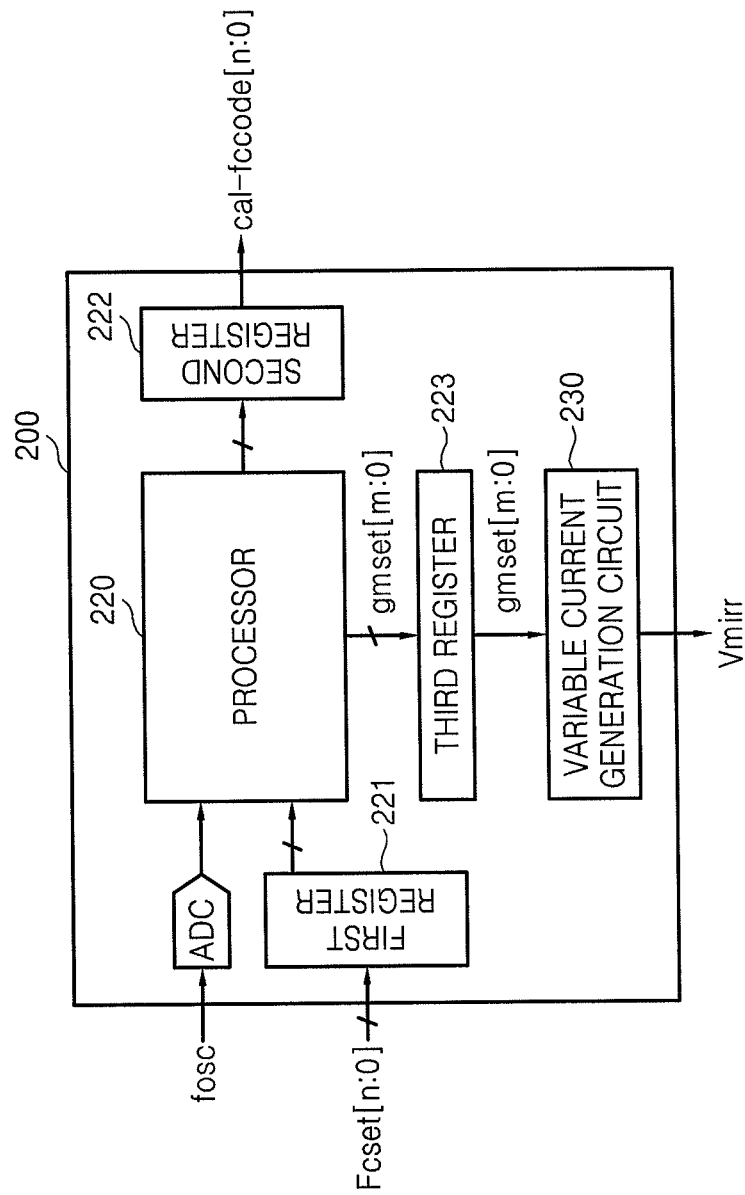
FIG. 2 illustrates a block diagram of an exemplary embodiment of a frequency calibration circuit employable by the frequency calibration device illustrated in FIG. 1.

FIG. 2 illustrates a block diagram of an exemplary embodiment of the frequency calibration circuit 200 illustrated in FIG. 1. Referring to FIG. 2, the frequency calibration circuit 200 may include an analog-to-digital converter (ADC), a processor 220, a first register 221, a second register 222, a third register 223, and a variable current generation circuit 230.

The ADC may receive the oscillation signal having the frequency $f_{osc}$ depending on the transconductance and capacitance of the $g_m$-C oscillator 100. The ADC may generate a frequency code corresponding to the frequency $f_{osc}$ of the oscillation signal and may output the frequency code to the processor 220.

The first register 221 may receive and store the reference code Fcset[n:0] provided from an external source. The first register 221 may provide the stored reference code Fcset[n:0] to the processor 220. The second register 222 may receive and store the calibration code cal_fccode[n:0]) generated by the processor 220. The second register 222 may output the stored calibration code cal_fccode[n:0] to the $g_m$-C filter 300. The third register 223 may receive and store a current control code gmset[m:0] determined by the processor 220. The third register 223 may output the current control code gmset[m:0] to the variable current generation circuit 230. For example, m may denote a natural number, and n=m or n≠m.

The processor 220 may generate the calibration code cal_fccode[n:0] capable of fine tuning the cut-off frequency of the $g_m$-C filter 300, according to the reference code Fcset[n:0] stored in the first register 221, the frequency of the main clock signal, and/or the frequency $f_{osc}$ of the oscillation signal. The processor 220 may also determine whether the calibration code cal_fccode[n:0] exists between a minimum value (for example, 0000000 when n is 6) of the reference code Fcset[n:0] and a maximum value (for example, 111111 when n is 6) thereof. The processor 220 may tune the calibration code cal_fccode[n:0] and/or generate the current control code gmset[m:0] according to a result of the determination regarding the calibration code cal_fccode[n:0].

In some embodiments, the processor 220 may generate the calibration code cal_fccode[n:0] according to a function expressed in Equation 1:

$$cal_{13\,fccode}[n:0] = (\{(X*f(mclk))/(f_{osc}*C)\} xd\, F_{cset}[n:0])) \quad [\text{Equation 1}]$$

In Equation 1, X and C may denote constant numbers, f(mclk) may denote the frequency of the main clock signal, and d_Fcset[n:0] may denote a decimal number corresponding to the reference code Fcset[n:0].

If there are no changes in the process distribution, the processor 220 may output a calibration code cal_fccode[n:0] equal to the reference code Fcset[n:0], according to Equation 1. However, if, e.g., the frequency $f_{osc}$ of the oscillation signal is higher than a frequency corresponding to the reference code Fcset[n:0] according to a change in the process distribution, the processor 220 may output a calibration code cal_fccode[n:0] smaller than the reference code Fcset[n:0] according to Equation 1.

For example, when the calibration code cal_fccode[n:0] generated by the processor 220 according to Equation 1 exists between the minimum value (for example, 0000000 when n is 6) and the maximum value (for example, 1111111 when n is 6) of the reference code Fcset[n:0], the processor 220 may output the calibration code cal_fccode[n:0] generated according to Equation 1 to the $g_m$-C filter 300. At this time, the $g_m$-C filter 300 may tune the transconductance of the $g_m$-C filter 300 according to the calibration code cal_fccode[n:0] output from the frequency calibration circuit 200 in order to tune the cut-off frequency.

On the other hand, when the calibration code cal_fccode[n:0] generated by the processor 220 according to Equation 1 is less than the minimum value (for example, 0000000 or 0000001) of the reference code Fcset[n:0] and thus cannot be expressed as the reference code Fcset[n:0], the processor 220 may not generate the calibration code cal_fccode[n:0] and may generate the current control code gmset[m:0] capable of tuning the variable current Vmirr.

If the frequency $f_{osc}$ of the oscillation signal is lower than the frequency corresponding to the reference code Fcset[n:0] according to a change in the process distribution, the processor 220 may output a calibration code cal_fccode[n:0] larger than the reference code Fcset[n:0] according to Equation 1.

For example, when the calibration code cal_fccode[n:0] generated by the processor 220 according to Equation 1 exists between the minimum value (for example, 0000000 when n is 6) and the maximum value (for example, 1111111 when n is 6) of the reference code Fcset[n:0], the processor 220 may output the calibration code cal_fccode[n:0] generated according to Equation 1 to the $g_m$-C filter 300. At this time, the $g_m$-C filter 300 may tune the transconductance of the $g_m$-C filter 300 according to the calibration code cal_fccode[n:0] output from the frequency calibration circuit 200 in order to tune the cut-off frequency.

On the other hand, when the calibration code cal_fccode[n:0] generated by the processor 220 according to Equation 1 is greater than the maximum value (for example, 11111112 (=127)) of the reference code Fcset[n:0], and thus, may not be expressed as the reference code Fcset[n:0], the processor 220 may not generate the calibration code cal_fccode[n:0] and may generate the current control code gmset[m:0] capable of tuning the variable current Vmirr.

In other words, when a value generated by the processor 220 according to Equation 1 cannot be expressed as the calibration code cal_fccode[n:0], the processor 220 may not generate the calibration code cal_fccode[n:0] and may generate the current control code gmset[m:0] capable of tuning the variable current Vmirr.

Accordingly, the variable current generation circuit 230 may generate the variable current Vmirr corresponding to the current control code gmset[m:0] generated by the processor 220. The $g_m$-C oscillator 100 capable of tuning the frequency $f_{osc}$ of the oscillation signal may tune the transconductance of the $g_m$-C oscillator 100 according to the variable current Vmirr, and the $g_m$-C filter 300 may simultaneously tune the transconductance of the $g_m$-C filter 300 according to the variable current Vmirr.

When the frequency $f_{osc}$ of the oscillation signal of the $g_m$-C oscillator 100 is tuned according to the variable current Vmirr, and the calibration code cal_fccode[n:0] generated by the processor 220 according to Equation 1 may fall between the minimum value (for example, 0000000 when n is 6) and the maximum value (for example, 1111111 when n is 6) of the reference code Fcset[n:0]. Thus, the processor 220 may output a tuned calibration code cal_fccode[n:0] to the $g_m$-C filter 300. Accordingly, the $g_m$-C filter 300 may fine tune the cut-off frequency according to the tuned calibration code cal_fccode[n:0].

Figure 3:
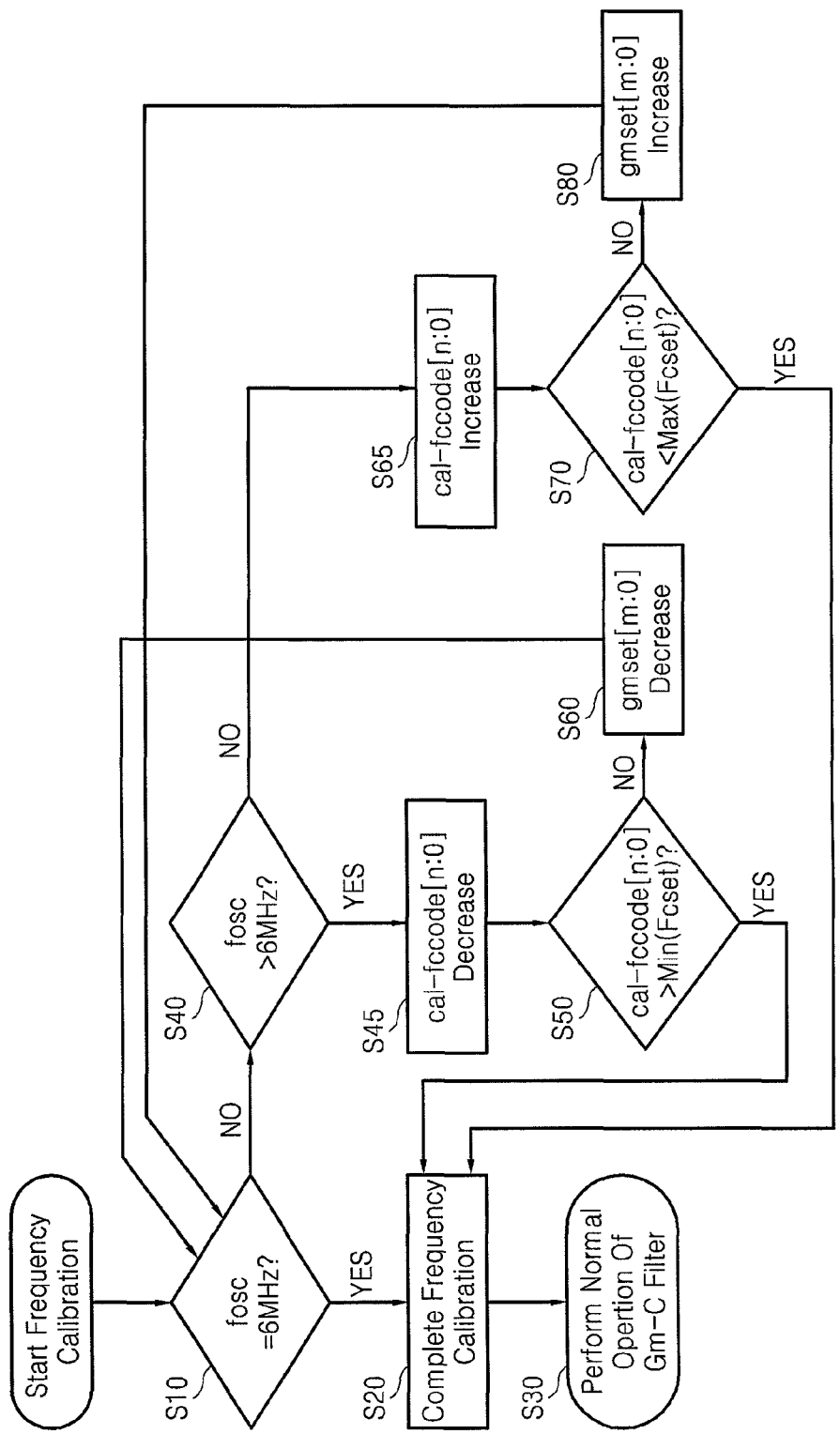
FIG. 3 illustrates a flowchart of an exemplary frequency calibration operation of the frequency calibration device illustrated in FIG. 1.

FIG. 3 illustrates a flowchart of a frequency calibration operation of the frequency calibration device 10 illustrated in FIG. 1. The frequency calibration operation of the frequency calibration circuit 200 will now be described in detail with reference to FIGS. 1 through 3.

In the following description, it is assumed, e.g., n is 6, the reference code Fcset[n:0] is '1111000$_2$=120', and the frequency $f_{osc}$ of the oscillation signal is 6 MHz. Under such conditions, according to Equation 1, the processor 220 may generate a calibration code cal_fccode[6:0]=1111000$_2$ equal to a reference code Fcset[6:0]=1111000$_2$=120.

During S10, is may determined whether the frequency $f_{osc}$ of the oscillation signal is 6 MHz. If, during S10, it is determined that the frequency $f_{osc}$ of the oscillation signal is 6 MHz, during S20, the frequency calibration circuit 200 may complete the frequency calibration and may output the calibration code cal_fccode[6:0]=1111000$_2$. During S30, since the $g_m$-C filter 300 may calibrate the cut-off frequency according to the calibration code cal_fccode[6:0]=1111000, the $g_m$-C filter 300 may perform a normal filtering operation of filtering input signals In(+) and In(−) and outputting output signals Out(+) and Out(−) corresponding to a result of the filtering. If, during S10, it is determined that the frequency $f_{osc}$ of the oscillation signal is not 6 MHz, during S40, it may be determined whether the frequency $f_{osc}$ of the oscillation signal is less than or greater than 6 MHz. If the frequency $f_{osc}$ is determined to be higher than 6 MHz, since the calibration code cal_fccode[6:0] is inversely proportional to the frequency $f_{osc}$ of the oscillation signal as shown in Equation 1, during S45, the processor 220 may generate a decreased calibration code cal_fccode[6:0].

During S50, the processor 220 may determine whether the decreased calibration code cal_fccode[6:0] is greater than the minimum value of the reference code Fcset[6:0]=1111000. If it is determined that the decreased calibration code cal_fccode[6:0] is greater than the minimum value (for example, 0000000) of the reference code Fcset[6:0], the processor 220 may output the decreased calibration code cal_fccode[6:0] to the $g_m$-C filter 300. Under such circumstances, the frequency calibration operation may be completed and, during S30, the $g_m$-C filter 300 may tune the cut-off frequency according to the decreased calibration code cal_fccode[6:0] output from the processor 220 and may perform a normal filtering operation with respect to the input signals In(+) and In(−).

During S50, if, e.g., the processor 220 determines that the decreased calibration code cal_fccode[6:0] is less than the minimum value (for example, 0000000 or 0000001) of the reference code Fcset[6:0], a value calculated according to Equation 1 cannot be expressed as the calibration code cal_fccode[6:0]. For example, if the value calculated according to Equation 1 is a prime number (e.g., 0.5) less than 1, during S60, the processor 220 may decrease the current control code gmset[m:0] to decrease the frequency $f_{osc}$ of the oscillation signal. The current control code gmset[m:0] decreased by the processor 220 may be stored in the third register 223.

The variable current generation circuit 230 may generate a variable current Vmirr corresponding to the current control code gmset[m:0] stored in the third register 223. The variable current Vmirr may be provided to both the $g_m$-C oscillator 100 and the $g_m$-C filter 300 at the same time. The $g_m$-C oscillator 100 may tune the transconductance of the $g_m$-C oscillator 100 in response to the variable current Vmirr and may output an oscillation signal having a decreased frequency $f_{osc}$ to the frequency calibration circuit 200. Thus, the frequency calibration circuit 200 may perform the operation S10 and/or S40 according to the oscillation signal having the decreased frequency $f_{osc}$.

Alternatively, when the frequency $f_{osc}$ of the oscillation signal is less than 6 MHz, since the calibration code cal_fccode[6:0] is inversely proportional to the frequency $f_{osc}$ of the oscillation signal as shown in Equation 1, during S65, the processor 220 may generate an increased calibration code cal_fccode[6:0].

During S70, the processor 220 may determine whether the increased calibration code cal_fccode[6:0] is greater than the maximum value of the reference code Fcset[6:0]=1111000. If it is determined that the increased calibration code cal_fccode[6:0] is less than the maximum value (for example, $1111111_2$=127) of the reference code Fcset[6:0], the processor 220 may output the increased calibration code cal_fccode[6:0] to the $g_m$-C filter 300. Thus, since during S20 the frequency calibration operation of the frequency calibration circuit 200 may be completed, during S30, the $g_m$-C filter 300 may tune the cut-off frequency according to the increased calibration code cal_fccode[6:0] output from the processor 220 and may perform the normal filtering operation with respect to the input signals In(+) and In(−).

On the other hand, if it is determined that the increased calibration code cal_fccode[6:0] is greater than the maximum value (for example, $1111111_2$=127) of the reference code Fcset[6:0], during S80, the processor 220 increases the current control code gmset[m:0]. For example, if the increased calibration code cal_fccode[6:0] is equal to or greater than 128, the calibration code cal_fccode[6:0] cannot express a value of 128 or a value greater than 128. Under such circumstances, e.g., during S80, the processor 220 may increase the current control code gmset[m:0] to increase the frequency $f_{osc}$ of the oscillation signal. The current control code gmset[m:0] increased by the processor 220 may be stored in the third register 223.

The variable current generation circuit 230 may generate a variable current Vmirr corresponding to the current control code gmset[m:0] stored in the third register 223. The variable current Vmirr may be provided to the $g_m$-C oscillator 100 and the $g_m$-C filter 300. The $g_m$-C oscillator 100 may tune the transconductance of the $g_m$-C oscillator 100 in response to the variable current Vmirr and may output an oscillation signal having an increased frequency $f_{osc}$ to the frequency calibration circuit 200. Thus, the frequency calibration circuit 200 may perform the operation S10 or S40 according to the oscillation signal having the increased frequency fosc.

As described above, the processor 220 of the frequency calibration circuit 200 may increase or decrease the current control code gmset[m:0] so that the calibration code cal_fccode[n:0] corresponding to the value generated according to Equation 1 exists within a predetermined range, e.g., between the minimum value and the maximum value of the reference code Fcset[n:0]. Accordingly, the variable current generation circuit 230 of the frequency calibration circuit 200 may generate the variable current Vmirr corresponding to the tuned current control code gmset[m:0], and the $g_m$-C oscillator 100 may tune the frequency $f_{osc}$ of the oscillation signal according to the variable current Vmirr. Thus, since the frequency calibration circuit 200 may adaptively tune the frequency fosc of the oscillation signal according to a change in the process distribution, the $g_m$-C filter 300 may tune the cut-off frequency according to the calibration code cal_fccode[n:0] determined by the processor 220. The transconductance of the $g_m$-C oscillator 100 and the transconductance of the $g_m$-C filter 300 may be tuned to a same variation value according to the variable current Vmirr.

Figure 4:
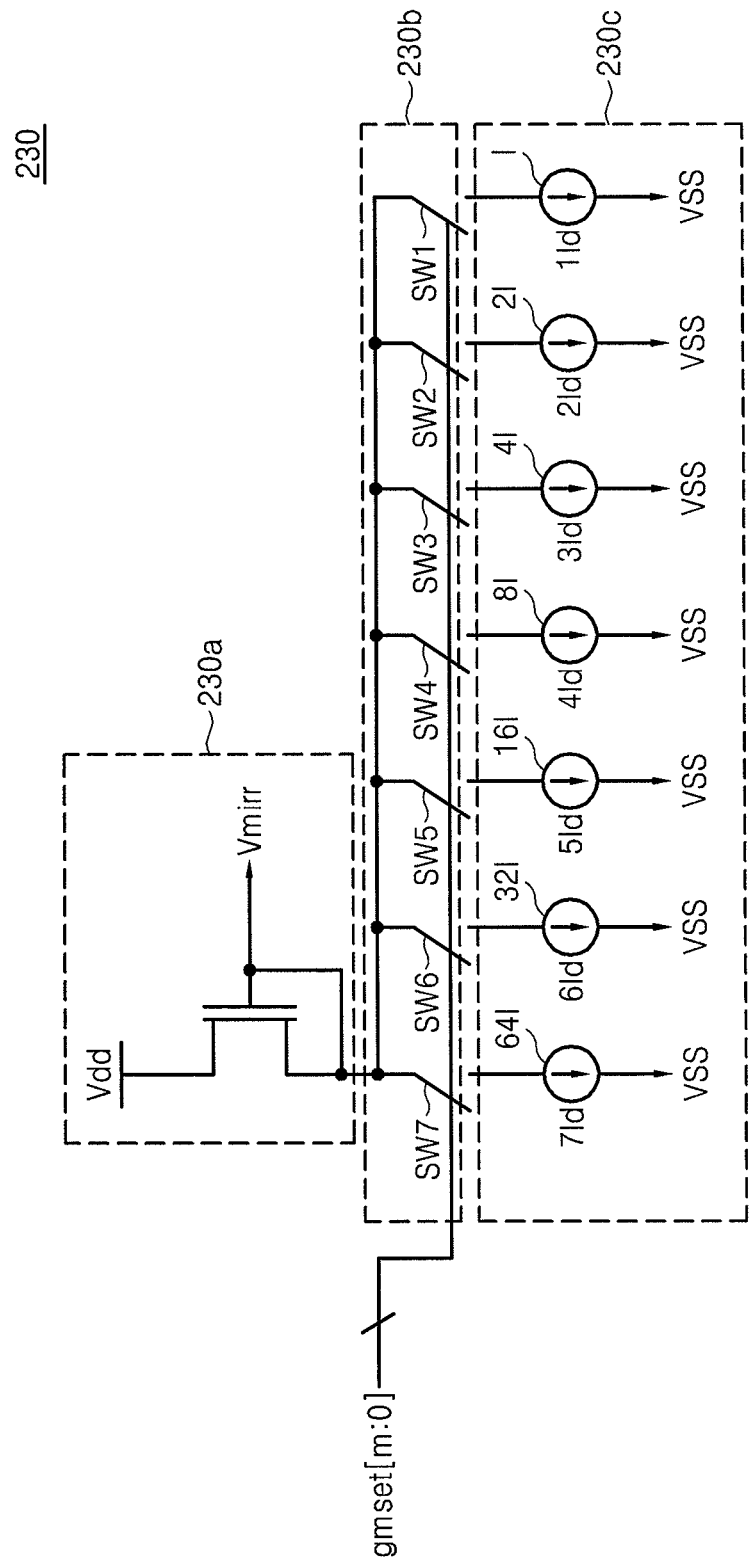
FIG. 4 illustrates a circuit diagram of an exemplary embodiment of a variable current generation circuit employable by the frequency calibration device illustrated in FIG. 1.

FIG. 4 illustrates a circuit diagram of an exemplary embodiment of the variable current generation circuit 230 illustrated in FIG. 2. Referring to FIG. 4, the variable current generation circuit 230 may include an output circuit 230a, a switching circuit 230b including a plurality of switches SW1 through SW7, and a current generation circuit 230c.

The output circuit 230a may output the variable current Vmirr. The output circuit 230a may include a diode-connected PMOSFET arranged between a line of a power supply voltage Vdd and the switching circuit 230b. Each of the plurality of switches SW1 through SW7 included in the switching circuit 230b may perform a switching operation in response to the current control code gmset[m:0]. For example, each of the plurality of switches SW1 through SW7 may be turned on/off in response to each bit included in the current control code gmset[m:0].

The current generation circuit 230c may include a plurality of current sources 1Id through 7Id. The plurality of current sources 1Id through 7Id may be connected between the plurality of switches SW1 through SW7 and a ground voltage VSS line, respectively. Each of the plurality of current sources 1Id through 7Id may generate a current having a weighted value.

Figure 5:
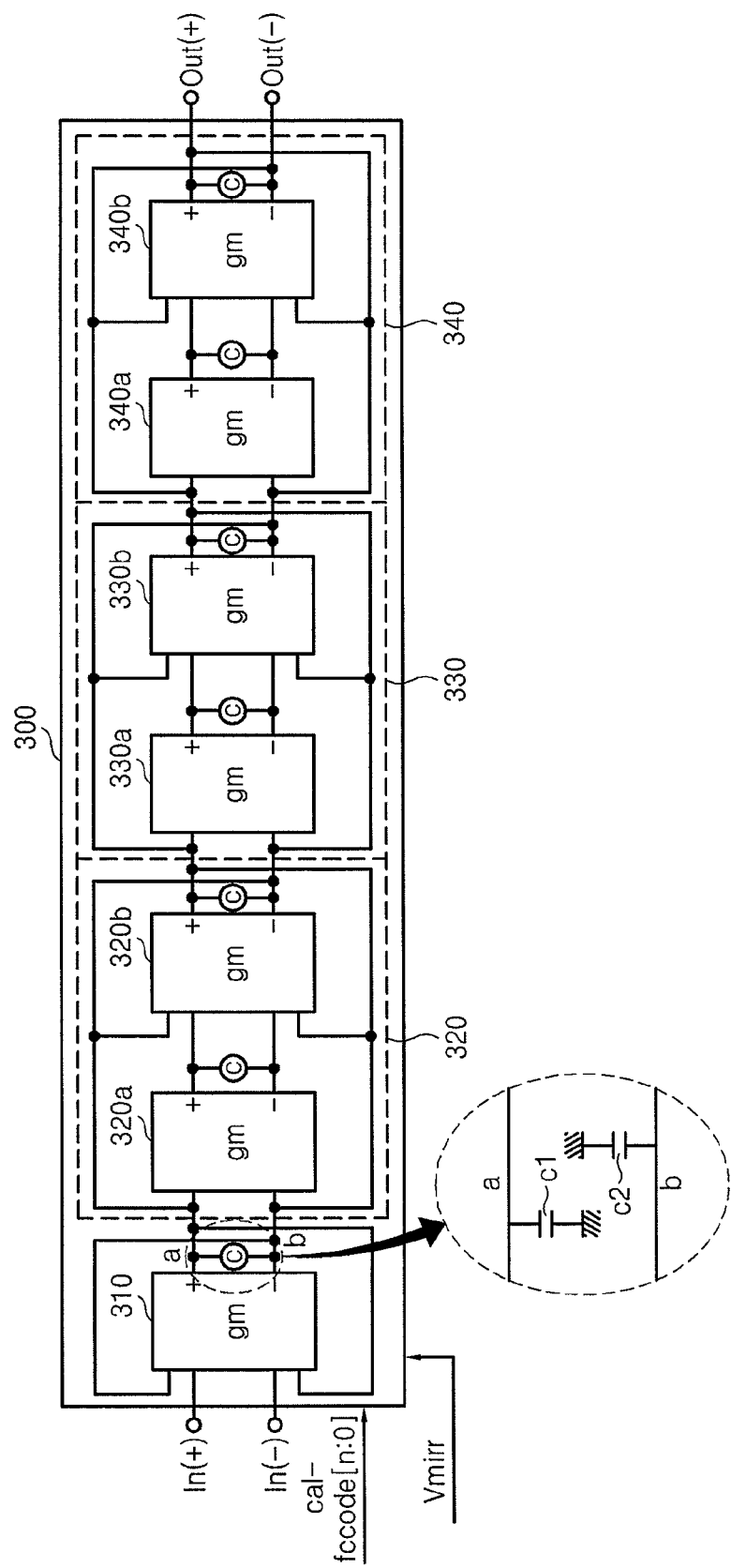
FIG. 5 illustrates a circuit diagram of an exemplary embodiment of a $g_m$-C filter employable by the frequency calibration device illustrated in FIG. 1.

FIG. 5 illustrates a circuit diagram of an exemplary embodiment of the $g_m$-C filter 300 illustrated in FIG. 1. More particularly, FIG. 5 illustrates a schematic circuit of a $7^{th}$-order $g_m$-C filter 300. Referring to FIG. 5, the $7^{th}$-order $g_m$-C filter 300 may perform filtering on the input signals In (+) and In (−) according to the calibration code cal_fccode[n:0] output by the frequency calibration circuit 200. The 7$^{th}$-order $g_m$-C filter 300 may tune the transconductance of the $g_m$-C filter 300 in response to the variable current Vmirr output from the frequency calibration circuit 200.

The 7$^{th}$-order $g_m$-C filter 300 may include a first low pass filter 310, a first biquad low pass filter 320, a second biquad low pass filter 330, and a third biquad low pass filter 340.

The first low pass filter 310 may perform low-pass filtering on the input signals In(+) and In(−). Capacitors C1 and C2 may be connected between output lines a,b of the first low pass filter 310 and ground voltage lines, respectively. A cut-off frequency of the first low pass filter 310 may depend on the transconductance gm of the first low pass filter 310 and the capacitances of the capacitors C1 and C2. Each of the first, second, and third biquad low pass filters 320, 330, 340 may include two low pass filters serially connected to each other.

The first biquad low pass filter 320 may amplify output signals of the first low pass filter 310 according to a first variable gain value. The second biquad low pass filter 330 may amplify output signals of the first biquad low pass filter 320 according to a second variable gain value. The third biquad low pass filter 340 may amplify output signals of the second biquad low pass filter 330 according to a third variable gain value. The third biquad low pass filter 340 may supply output signals Out(+), Out(−).

Figure 6:
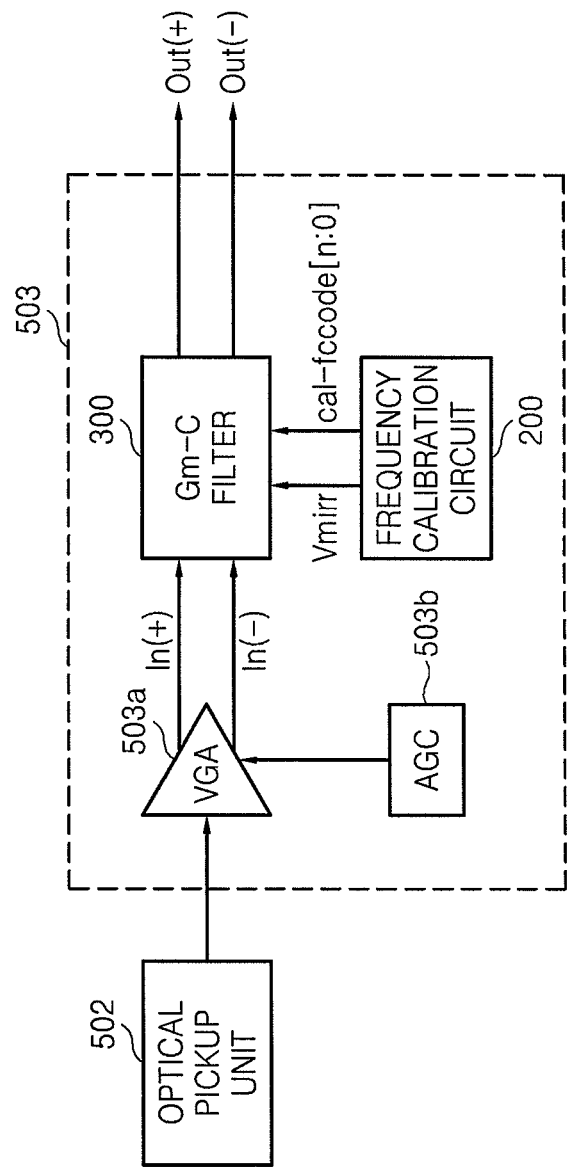
FIG. 6 illustrates a block diagram of an exemplary analog front end device including the frequency calibration device illustrated in FIG. 1.

FIG. 6 illustrates a block diagram of an analog front end device 503 including the frequency calibration circuit 200 illustrated in FIG. 1. Referring to FIG. 6, the analog front end device 503 may be employed in a data processing system. More particularly, e.g., the analog front end device 503 may be employed in an optical recording/reproducing apparatus. The analog front end device 503 may include a voltage gain amplifier (VGA) 503a, the frequency calibration circuit 200, and the $g_m$-C filter 300. The analog front end device 503 may further include an automatic gain controller (AGC) 503b.

The VGA 503a may amplify signals picked up by an optical pickup unit 502. The optical pickup unit 502 may write data to an optical recording medium or read data from the optical recording medium, e.g., a tangible, non-transitory recording medium. The computer readable recording medium may be any data storage device that can store data which can be thereafter read by a computer system. Examples of the computer readable recording medium may include read-only memory (ROM), random-access memory (RAM), electrically erasable programmable ROM (EEPROM), and flash memory.

The frequency calibration circuit 200 may provide at least one of the variable current Vmirr and the calibration code cal_fccode[n:0] to the $g_m$-C filter 300 in order to tune the cut-off frequency of the $g_m$-C filter 300. The $g_m$-C filter 300 may perform filtering on amplified signals obtained by the VGA 503a and output the signals Out(+) and Out(−) corresponding to a result of the filtering. The AGC 503b may tune a gain of the VGA 503a.

The frequency calibration circuit 200 may tune the transconductance of the $g_m$-C filter 300 by using the variable current Vmirr. Accordingly, the $g_m$-C filter 300 may tune the cut-off frequency to a normal cut-off frequency corresponding to a predetermined reference case, e.g., when there are no changes in the process distribution, even when there is a change in the process distribution.

The method of calibrating the frequency of a $g_m$-C filter according to an embodiment may be written as a computer-readable program code and stored in a recording medium, for example, the processor 220 or a memory that can be accessed by the processor 220. Aspects described herein may be embodied in hardware, software, firmware or combination thereof. When the method is embodied in software, it can be embodied as computer readable codes or programs on a computer readable recording medium, e.g. a tangible, non-transitory recording medium.

According to a frequency calibration method and a device performing the same according to embodiments employing one or more features described herein, transconductances of a $g_m$-C oscillator and a $g_m$-C filter may each be tuned according to a variable current. Embodiments may enable a change in the frequency of the $g_m$-C filter due to a process distribution to be prevented and/or compensated for. Embodiments may provide a frequency calibration method and/or a device adapted to perform such a frequency calibration method that may have a relatively high cut-off frequency of a $g_m$-C filter. As the cut off frequency may be proportional to the transconductance and inversely proportional to the capacitance, while realizing a capacitor having relatively lower capacitance may be more challenging, embodiments may provide a frequency calibration method and/or a device adapted to perform such a frequency calibration method that may have a relatively high cut-off frequency of a $g_m$-C filter by performing tuning according to a variable current.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of calibrating a frequency of a $g_m$-C filter, the method comprising:

generating, by a frequency calibration circuit, a calibration code for tuning a cut-off frequency of the $g_m$-C filter according to a received reference code and a frequency of an oscillation signal that is output from a $g_m$-C oscillator;

determining, by the frequency calibration circuit, whether the calibration code exists within a range of the received reference code; and outputting, by the frequency calibration circuit, the calibration code to the $g_m$-C filter when the calibration code is within the range of the reference code, and outputting a current control code when the calibration code is outside the range of the reference code to generate a variable current to tune a transconductance of the $g_m$-C oscillator and a transconductance of the $g_m$-C filter, wherein tuning the transconductance of the $g_m$-C oscillator changes the frequency of the oscillation signal and tuning the transconductance of the $g_m$-C filter adjusts a cut-off frequency of the $g_m$-C filter.

2. The method as claimed in claim 1, wherein the calibration code is directly proportional to a ratio of a frequency of a main clock signal and the frequency of the oscillation signal.

3. The method as claimed in claim 1, wherein, when the calibration code is less than a minimum value of the range of the reference code, the variable current is generated for decreasing the frequency of the oscillation signal, the $g_m$-C oscillator decreases the transconductance of the $g_m$-C oscillator in response to the variable current, and the the transconductance of the $g_m$-C filter is reduced in response to the variable current to adjust the cut-off frequency.

4. The method as claimed in claim 1, wherein when the calibration code is greater than a maximum value of the range of the reference code, the variable current is generated for increasing the frequency of the oscillation signal, the $g_m$-C oscillator increases the transconductance of the $g_m$-C oscillator in response to the variable current, and the transconductance of the $g_m$-C filter in increased in response to the variable current.

5. The method as claimed in claim 1, wherein the transconductance of the $g_m$-C oscillator is tuned to a same variation value as a variation value of the transconductance of the $g_m$-C filter by the variable current.

6. A frequency calibration device adapted to calibrate a frequency of a $g_m$-C filter, the frequency calibration device comprising:
   a $g_m$-C oscillator configured to generate an oscillation signal having a frequency that varies, and
   a frequency calibration circuit configured to generate a calibration code to tune a cut-off frequency of the $g_m$-C filter, according to the frequency of the oscillation signal and a received reference code, wherein the frequency calibration circuit determines whether the calibration code exists within the range of the received reference code and outputs the calibration code to the $g_m$-C filter when the calibration code is within the range and generates a current control code when the calibration code is outside the range to generate a variable current to tune a transconductance of the $g_m$-C oscillator and a transconductance of the $g_m$-C filter, wherein tuning the transconductance of the $g_m$-C oscillator changes the frequency of the oscillation signal and tuning the transconductance of the $g_m$-C filter adjusts the cut-off frequency of the $g_m$-C filter.

7. The frequency calibration device as claimed in claim 6, wherein the calibration code is directly proportional to a ratio a frequency of a main clock signal and the frequency of the oscillation signal.

8. The frequency calibration device as claimed in claim 6, wherein when it is determined that the calibration code is less than a minimum value of the reference code, the frequency calibration circuit generates the variable current for decreasing the frequency of the oscillation signal, the $g_m$-C oscillator decreases the transconductance of the $g_m$-C oscillator in response to the variable current, and the $g_m$-C filter decreases the transconductance of the $g_m$-C filter in response to the variable current.

9. The frequency calibration device as claimed in claim 6, wherein when it is determined that the calibration code is greater than a maximum value of the reference code, the frequency calibration circuit generates the variable current for increasing the frequency of the oscillation signal, the $g_m$-C oscillator increases the transconductance of the $g_m$-C oscillator in response to the variable current, and the $g_m$-C filter increases the transconductance of the $g_m$-C filter in response to the variable current.

10. The frequency calibration device as claimed in claim 6, wherein the transconductance of the $g_m$-C oscillator is tuned to a same variation value as a variation value of the transconductance of the $g_m$-C filter by the variable current.

11. The frequency calibration device as claimed in claim 6, wherein the frequency calibration circuit comprises:
   a first register configured to store the reference code;
   a second register configured to store the calibration code;
   a third register configured to store a current control code;
   a microprocessor configured to generate the calibration code adapted to tune the cut-off frequency of the $g_m$-C filter according to the reference code stored in the first register and the frequency of the oscillation signal and stores the calibration code in the second register; and
   a variable current generation circuit configured to generate the variable current for simultaneously tuning the transconductance of the $g_m$-C oscillator and the transconductance of the $g_m$-C filter in response to the current control code, wherein the microprocessor determines whether the calibration code exists within the range of the reference code, tunes the calibration code according to a result of the determination, and generates the current control code.

12. A data processing system, comprising:
   a non-transitory recording medium configured to store data;
   a pickup unit configured to pick up the data stored in the recording medium;
   a voltage control amplifier configured to amplify a signal output by the pickup unit;
   a $g_m$-C filter configured to perform filtering on an amplified signal obtained by the voltage control amplifier; and
   a frequency calibration device configured to generate a calibration code or a reference current adapted to tune a cut-off frequency of the $g_m$-C filter, wherein the frequency calibration device, includes:
   a $g_m$-C oscillator configured to generate an oscillation signal having a frequency that varie; and
   a frequency calibration circuit configured to generate the calibration code according to the frequency of the oscillation signal and a received reference code, wherein the frequency calibration circuit determines whether the calibration code exists within the range of the received reference code and outputs the calibration code to the $g_m$-C filter when the calibration code is within the range and generates a current control code when the calibration code is outside the range to generate a variable current to tune a transconductance of the $g_m$-C oscillator and a transconductance of the $g_m$-C filter, wherein tuning the transconductance of the $g_m$-C oscillator changes the frequency of the oscillation signal and tuning the transconductance of the $g_m$-C filter adjusts the cut-off frequency of the $g_m$-C filter.

13. The data processing system as claimed in claim 12, wherein the frequency calibration circuit generates the calibration code corresponding to a ratio of a frequency of a main clock signal and the frequency of the oscillation signal.

14. The data processing system as claimed in claim 12, wherein when it is determined that the calibration code is greater than a maximum value of the reference code, the frequency calibration circuit generates the variable current for increasing the frequency of the oscillation signal, the $g_m$-C oscillator increases the transconductance of the $g_m$-C oscillator in response to the variable current, and the $g_m$-C filter increases the transconductance of the $g_m$-C filter in response to the variable current.

* * * * *